(12) United States Patent
Lin et al.

(10) Patent No.: US 11,856,789 B2
(45) Date of Patent: Dec. 26, 2023

(54) FERROEOLECTRIC MEMORIES WITH FERROELECTRIC COMPOSITE LAYER

(71) Applicant: Industrial Technology Research Institute, Hsinchu (TW)

(72) Inventors: Yu-De Lin, Taoyuan (TW); Po-Chun Yeh, Taichung (TW); Pei-Jer Tzeng, Hsinchu County (TW)

(73) Assignee: INDUSTRIAL TECHNOLOGY RESEARCH INSTITUTE, Hsinchu (TW)

( * ) Notice: Subject to any disclaimer, the term of this patent is extended or adjusted under 35 U.S.C. 154(b) by 15 days.

(21) Appl. No.: 17/368,686

(22) Filed: Jul. 6, 2021

(65) Prior Publication Data
US 2022/0359549 A1    Nov. 10, 2022

(30) Foreign Application Priority Data
May 7, 2021    (TW) .................. 110116532

(51) Int. Cl.
*H10B 53/30*    (2023.01)
*G11C 11/22*    (2006.01)

(52) U.S. Cl.
CPC .............. *H10B 53/30* (2023.02); *G11C 11/22* (2013.01); *H01L 2924/1441* (2013.01)

(58) Field of Classification Search
CPC ....... H01L 27/11507; H01L 2924/1441; H01L 28/56; H01L 28/40; G11C 11/22; H10B 53/30
See application file for complete search history.

(56) References Cited

U.S. PATENT DOCUMENTS

| | | |
|---|---|---|
| 6,686,620 B2 | 2/2004 | An et al. |
| 6,794,705 B2 | 9/2004 | Lian et al. |
| 6,830,983 B2 | 12/2004 | Marsh |
| 7,312,091 B2 | 12/2007 | Lee et al. |
| 8,093,070 B2 | 1/2012 | Celii et al. |
| 2013/0137233 A1 | 5/2013 | Czabaj et al. |

(Continued)

FOREIGN PATENT DOCUMENTS

| | | |
|---|---|---|
| CN | 1543652 A | 11/2004 |
| CN | 101114695 B | 4/2011 |

(Continued)

OTHER PUBLICATIONS

Pesic, Milan, et al. "How to make DRAM non-volatile Antiferroelectrics: A new paradigm for universal memories" International Electron Devices Meeting, 2016, 4 pages, IEEE, US.

(Continued)

*Primary Examiner* — Jerome Leboeuf

(57) ABSTRACT

A ferroelectric memory includes a first electrode, a second electrode opposite to the first electrode, a ferroelectric composite layer disposed between the first electrode and the second electrode, and a first insulating layer disposed on one side of the ferroelectric composite layer. The ferroelectric composite layer includes a first electrode layer, a second electrode layer, a ferroelectric layer and an antiferroelectric layer. The first electrode layer is opposite to the second electrode layer, and the ferroelectric layer and the antiferroelectric layer are disposed between the first electrode layer and the second electrode layer.

17 Claims, 7 Drawing Sheets

(56) References Cited

U.S. PATENT DOCUMENTS

| | | | |
|---|---|---|---|
| 2014/0021427 A1 | 1/2014 | Ishibashi | |
| 2018/0151577 A1 | 5/2018 | Mueller et al. | |
| 2019/0122824 A1* | 4/2019 | Lien | H01G 4/1227 |
| 2019/0131420 A1* | 5/2019 | Lu | H01L 21/02189 |
| 2019/0148390 A1* | 5/2019 | Frank | H01L 28/55 |
| | | | 257/295 |
| 2020/0035807 A1* | 1/2020 | Chen | H01L 29/40114 |
| 2021/0343856 A1* | 11/2021 | Haratipour | H01L 29/221 |
| 2022/0278115 A1* | 9/2022 | Wei | H01L 27/11507 |
| 2022/0350523 A1* | 11/2022 | Trantham | G11C 11/22 |

FOREIGN PATENT DOCUMENTS

| | | |
|---|---|---|
| TW | 517347 | 1/2003 |
| TW | I706581 B | 10/2020 |
| TW | 202101742 A | 1/2021 |

OTHER PUBLICATIONS

Lin Y. D., et al. "3D Scalable, Wake-up Free, and Highly Reliable FRAM Technology with StressEngineered HfZrOx" International Electron Devices Meeting, 2019, 4 pages, IEEE, US.

Boscke, T.S., et al. "Phase transitions in ferroelectric silicon doped hafnium oxide" Applied Physics Letters 99, 2011, 4 pages, American Institute of Physics, US.

Fengler, Franz P.G., et al. "Comparison of hafnia and PZT based ferroelectrics for future non-volatile FRAM applications" European Solid-State Device Research Conference, 2016, pp. 369-372, IEEE, US.

Yurchuck, Ekaterina, et al. "Origin of the endurance degradation in the novel HfO2-based 1T ferroelectric non-volatile memories" IEEE International Reliability Physics Symposium, Waikoloa, HI, 2014, 5 pages, IEEE, US.

Taiwan Patent Office, Office Action, Patent Application Serial No. 110116532, dated Jan. 7, 2022, Taiwan.

* cited by examiner

FERROELECTRIC MEMORIES WITH FERROELECTRIC COMPOSITE LAYER

CROSS REFERENCE TO RELATED APPLICATIONS

This application claims priority of Taiwan Patent Application No. 110116532, filed on May 7, 2021, the entirety of which is incorporated by reference herein.

TECHNICAL FIELD

The disclosure relates to ferroelectric memory, and relates to a ferroelectric memory with a current limiting layer.

BACKGROUND

Ferroelectric memory is a type of destructive read memory that requires a large number of operations. Therefore, it is valuable to know how to increase the number of operations. Conventional ferroelectric memory technology is based on hafnium oxide (HfO) materials; meaning that after $10^6$ cycles, its operational efficiency will begin to degrade, which does not meet the needs of the industry.

SUMMARY

In one embodiment of the disclosure, a ferroelectric memory is provided. The ferroelectric memory includes a first electrode; a second electrode opposite to the first electrode; a ferroelectric composite layer disposed between the first electrode and the second electrode; and a first insulating layer disposed on one side of the ferroelectric composite layer.

In one embodiment, the ferroelectric composite layer includes a first electrode layer, a second electrode layer, a ferroelectric layer and an antiferroelectric layer, wherein the first electrode layer is opposite to the second electrode layer, and the ferroelectric layer and the antiferroelectric layer are disposed between the first electrode layer and the second electrode layer. In one embodiment, the first electrode layer and the second electrode layer include titanium nitride. In one embodiment, the first electrode layer and the second electrode layer have a dominant crystallographic orientation of (220). In one embodiment, the ferroelectric layer and the antiferroelectric layer are arranged with one another in a perpendicular direction. In one embodiment, the ferroelectric layer and the antiferroelectric layer are arranged with one another in a horizontal direction. In one embodiment, the ferroelectric layer and the antiferroelectric layer include hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), barium titanate ($BaTiO_3$), zirconium oxide ($ZrO_x$) or hafnium aluminum oxide ($HfAlO_x$).

In one embodiment, the ferroelectric memory further include a second insulating layer disposed on the other side of the ferroelectric composite layer. In one embodiment, the first insulating layer and the second insulating layer include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlOx), aluminum titanium carbonitrides (AlTiCN), zinc oxide (ZnO) or zirconium oxide (ZrOx).

In one embodiment of the disclosure, a ferroelectric memory is provided. The ferroelectric memory includes a substrate; a first electrode disposed in the substrate; a patterned oxide layer disposed on the substrate, exposing a part of the first electrode; a ferroelectric composite layer disposed on the exposed first electrode and located within the patterned oxide layer; a first insulating layer disposed on one side of the ferroelectric composite layer; and a second electrode disposed on the ferroelectric composite layer.

In one embodiment, the ferroelectric composite layer includes a first electrode layer, a second electrode layer and a ferroelectric layer, wherein the first electrode layer is opposite to the second electrode layer, and the ferroelectric layer is disposed between the first electrode layer and the second electrode layer. In one embodiment, the ferroelectric memory further includes an antiferroelectric layer disposed between the first electrode layer and the second electrode layer. In one embodiment, the ferroelectric layer and the antiferroelectric layer are connected to each other.

In the disclosure, an insulating layer with a current limiting effect is arranged on one or both sides of the ferroelectric composite layer. The above-mentioned insulating layer provides a current limiting mechanism such as a Schottky barrier or Poole-Frenkel conduction, which limits the transient current of the component during high-speed operation, reducing the damage of the current to the components. Therefore, even if it has entered the fatigue effect stage, the component can still maintain a considerable amount of polarization, slowing down the deterioration rate of the component, and increasing the number of operations of the component. After circuit simulation, the above-mentioned insulating layer can provide a good current limiting effect without affecting circuit read. The current range of the disclosed ferroelectric memory is between 50 µA and 150 µA.

A detailed description is given in the following embodiments with reference to the accompanying drawings.

BRIEF DESCRIPTION OF THE DRAWINGS

The disclosure can be more fully understood by reading the subsequent detailed description and examples with references made to the accompanying drawings, wherein.

DETAILED DESCRIPTION

The following description is of the best-contemplated mode of carrying out the disclosure. This description is made for the purpose of illustrating the general principles of the disclosure and should not be taken in a limiting sense. The scope of the disclosure is determined by reference to the appended claims.

Figure 1:
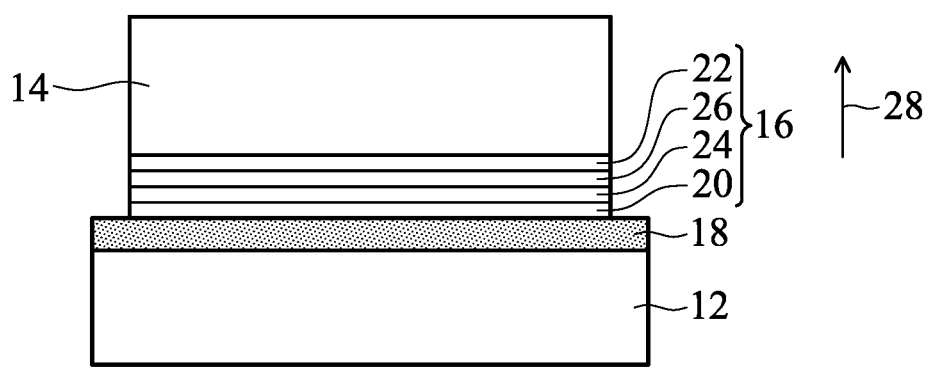
FIG. 1 is a cross-sectional view of a ferroelectric memory in accordance with one embodiment of the present disclosure.

Referring to FIG. 1, in accordance with one embodiment of the disclosure, a ferroelectric memory (Ferroelectric RAM; FeRAM) 10 is provided. FIG. 1 is a cross-sectional view of the ferroelectric memory 10. In order to increase the number of operations of a ferroelectric memory, the present disclosure provides a ferroelectric memory. Using an insulating layer with a current limiting effect on one or both sides of a ferroelectric composite layer to limit the transient current of the component during high-speed operation, thereby increasing the service life of the ferroelectric memory.

As shown in FIG. 1, the ferroelectric memory 10 includes a first electrode 12, a second electrode 14, a ferroelectric composite layer 16 and an insulating layer 18. The first electrode 12 is opposite to the second electrode 14. The ferroelectric composite layer 16 is disposed between the first electrode 12 and the second electrode 14. The insulating layer 18 is disposed on one side of the ferroelectric composite layer 16. In FIG. 1, the insulating layer 18 is disposed between the first electrode 12 and the ferroelectric composite layer 16. That is, the insulating layer 18 is disposed on the side of the ferroelectric composite layer 16 facing the first electrode 12, and is in contact with the first electrode 12 and the ferroelectric composite layer 16 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 1, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 1, the ferroelectric layer 24 is disposed on the first electrode layer 20. The antiferroelectric layer 26 is disposed on the ferroelectric layer 24. The second electrode layer 22 is disposed on the antiferroelectric layer 26. In one embodiment, the arrangement of the ferroelectric layer 24 and the antiferroelectric layer 26 can also be interchanged. For example, the antiferroelectric layer 26 is disposed on the first electrode layer 20. The ferroelectric layer 24 is disposed on the antiferroelectric layer 26. The second electrode layer 22 is disposed on the ferroelectric layer 24 (not shown). In one embodiment, a plurality of ferroelectric layers 24 and a plurality of antiferroelectric layers 26 may be included between the first electrode layer 20 and the second electrode layer 22, which are arranged to alternate with one another in a perpendicular direction 28 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), barium titanate ($BaTiO_3$), zirconium oxide ($ZrO_x$) or hafnium aluminum oxide ($HfAlO_x$), however, the present disclosure is not limited thereto, and other suitable ferroelectric materials are also applicable.

In one embodiment, the insulating layer 18 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide ($AlO_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 1, the insulating layer 18 is in contact with the first electrode 12 and the first electrode layer 20 of the ferroelectric composite layer 16 respectively.

Figure 2:
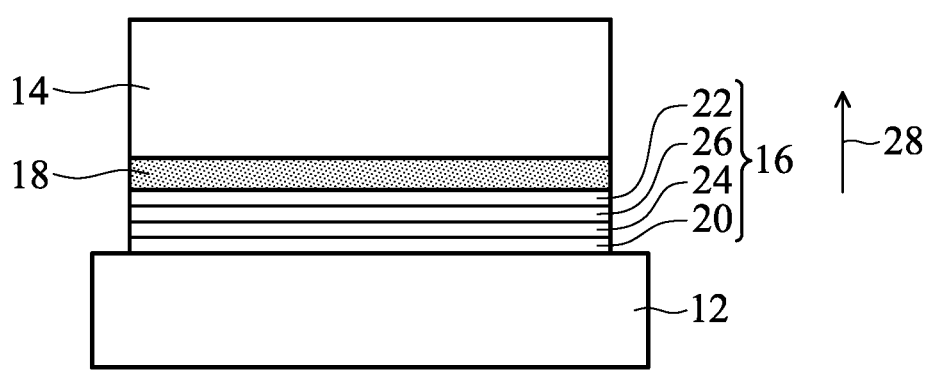
FIG. 2 is a cross-sectional view of a ferroelectric memory in accordance with one embodiment of the present disclosure.

Referring to FIG. 2, in accordance with one embodiment of the present disclosure, a ferroelectric memory (Ferroelectric RAM; FeRAM) 10 is provided. FIG. 2 is a cross-sectional view of the ferroelectric memory 10.

As shown in FIG. 2, the ferroelectric memory 10 includes a first electrode 12, a second electrode 14, a ferroelectric composite layer 16 and an insulating layer 18. The first electrode 12 is opposite to the second electrode 14. The ferroelectric composite layer 16 is disposed between the first electrode 12 and the second electrode 14. The insulating layer 18 is disposed on one side of the ferroelectric composite layer 16. In FIG. 2, the insulating layer 18 is disposed between the ferroelectric composite layer 16 and the second electrode 14. That is, the insulating layer 18 is disposed on the side of the ferroelectric composite layer 16 facing the second electrode 14, and is in contact with the ferroelectric composite layer 16 and the second electrode 14 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 2, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 2, the ferroelectric layer 24 is disposed on the first electrode layer 20. The antiferroelectric layer 26 is disposed on the ferroelectric layer 24. The second electrode layer 22 is disposed on the antiferroelectric layer 26. In one embodiment, the arrangement of the ferroelectric layer 24 and the antiferroelectric layer 26 can also be interchanged. For example, the antiferroelectric layer 26 is disposed on the first electrode layer 20. The ferroelectric layer 24 is disposed on the antiferroelectric layer 26. The second electrode layer 22 is disposed on the ferroelectric layer 24 (not shown). In one embodiment, a plurality of ferroelectric layers 24 and a plurality of antiferroelectric layers 26 may be included between the first electrode layer 20 and the second electrode layer 22, which are arranged to alternate with one another in a perpendicular direction 28 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the insulating layer 18 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 2, the insulating layer 18 is in contact with the second electrode layer 22 of the ferroelectric composite layer 16 and the second electrode 14 respectively.

Figure 3:
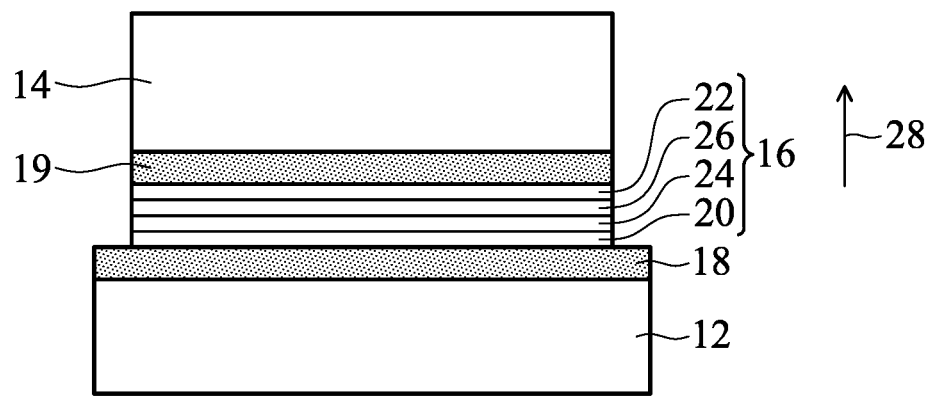
FIG. 3 is a cross-sectional view of a ferroelectric memory in accordance with one embodiment of the present disclosure.

Referring to FIG. 3, in accordance with one embodiment of the present disclosure, a ferroelectric memory (Ferroelectric RAM; FeRAM) 10 is provided. FIG. 3 is a cross-sectional view of the ferroelectric memory 10.

As shown in FIG. 3, the ferroelectric memory 10 includes a first electrode 12, a second electrode 14, a ferroelectric composite layer 16, a first insulating layer 18 and a second insulating layer 19. The first electrode 12 is opposite to the second electrode 14. The ferroelectric composite layer 16 is disposed between the first electrode 12 and the second electrode 14. The first insulating layer 18 is disposed on one side of the ferroelectric composite layer 16. The second insulating layer 19 is disposed on the other side of the ferroelectric composite layer 16. In FIG. 3, the first insulating layer 18 is disposed between the first electrode 12 and the ferroelectric composite layer 16. That is, the first insulating layer 18 is disposed on the side of the ferroelectric composite layer 16 facing the first electrode 12, and is in contact with the first electrode 12 and the ferroelectric composite layer 16 respectively. In addition, the second insulating layer 19 is disposed between the ferroelectric composite layer 16 and the second electrode 14. That is, the second insulating layer 19 is disposed on the side of the ferroelectric composite layer 16 facing the second electrode 14, and is in contact with the ferroelectric composite layer 16 and the second electrode 14 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 3, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 3, the ferroelectric layer 24 is disposed on the first electrode layer 20. The antiferroelectric layer 26 is disposed on the ferroelectric layer 24. The second electrode layer 22 is disposed on the antiferroelectric layer 26. In one embodiment, the arrangement of the ferroelectric layer 24 and the antiferroelectric layer 26 can also be interchanged. For example, the antiferroelectric layer 26 is disposed on the first electrode layer 20. The ferroelectric layer 24 is disposed on the antiferroelectric layer 26. The second electrode layer 22 is disposed on the ferroelectric layer 24 (not shown). In one embodiment, a plurality of ferroelectric layers 24 and a plurality of antiferroelectric layers 26 may be included between the first electrode layer 20 and the second electrode layer 22, which are arranged to alternate with one another in a perpendicular direction 28 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the first insulating layer 18 and the second insulating layer 19 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 3, the first insulating layer 18 is in contact with the first electrode 12 and the first electrode layer 20 of the ferroelectric composite layer 16 respectively. The second insulating layer 19 is in contact with the second electrode layer 22 of the ferroelectric composite layer 16 and the second electrode 14 respectively.

Figure 4:
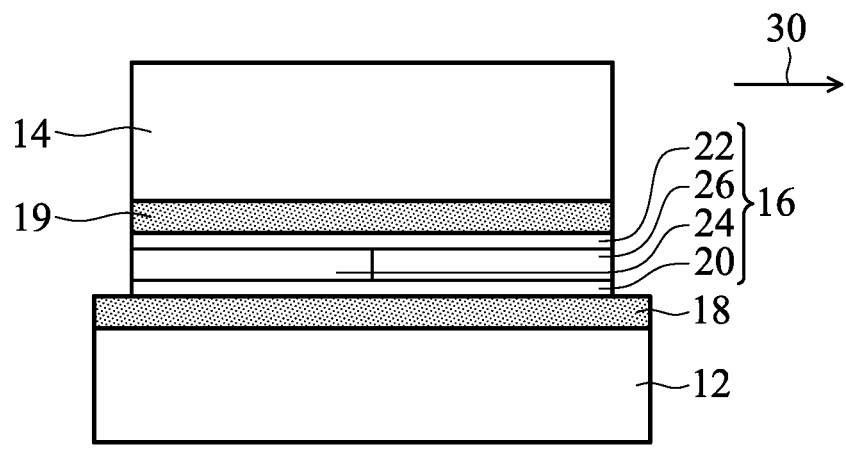
FIG. 4 is a cross-sectional view of a ferroelectric memory in accordance with one embodiment of the present disclosure.

Referring to FIG. 4, in accordance with one embodiment of the present disclosure, a ferroelectric memory (Ferroelectric RAM; FeRAM) 10 is provided. FIG. 4 is a cross-sectional view of the ferroelectric memory 10.

As shown in FIG. 4, the ferroelectric memory 10 includes a first electrode 12, a second electrode 14, a ferroelectric composite layer 16, a first insulating layer 18 and a second insulating layer 19. The first electrode 12 is opposite to the second electrode 14. The ferroelectric composite layer 16 is disposed between the first electrode 12 and the second electrode 14. The first insulating layer 18 is disposed on one side of the ferroelectric composite layer 16. In FIG. 4, the first insulating layer 18 is disposed between the first electrode 12 and the ferroelectric composite layer 16. That is, the first insulating layer 18 is disposed on the side of the ferroelectric composite layer 16 facing the first electrode 12, and is in contact with the first electrode 12 and the ferroelectric composite layer 16 respectively. The second insulating layer 19 is disposed on the other side of the ferroelectric composite layer 16. In FIG. 4, the second insulating layer 19 is disposed between the ferroelectric composite layer 16 and the second electrode 14. That is, the second insulating layer 19 is disposed on the side of the ferroelectric composite layer 16 facing the second electrode 14, and is in contact with the ferroelectric composite layer 16 and the second electrode 14 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 4, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 4, the ferroelectric layer 24 and the antiferroelectric layer 26 are disposed between the first electrode layer 20 and the second electrode layer 22 in a horizontal direction 30. In one embodiment, a plurality of ferroelectric layers 24 and a plurality of antiferroelectric layers 26 may be included between the first electrode layer 20 and the second electrode layer 22, which are arranged to alternate with one another in the horizontal direction 30 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the first insulating layer 18 and the second insulating layer 19 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 4, the first insulating layer 18 is in contact with the first electrode 12 and the first electrode layer 20 of the ferroelectric composite layer 16 respectively. The second insulating layer 19 is in contact with the second electrode layer 22 of the ferroelectric composite layer 16 and the second electrode 14 respectively.

Figure 5:
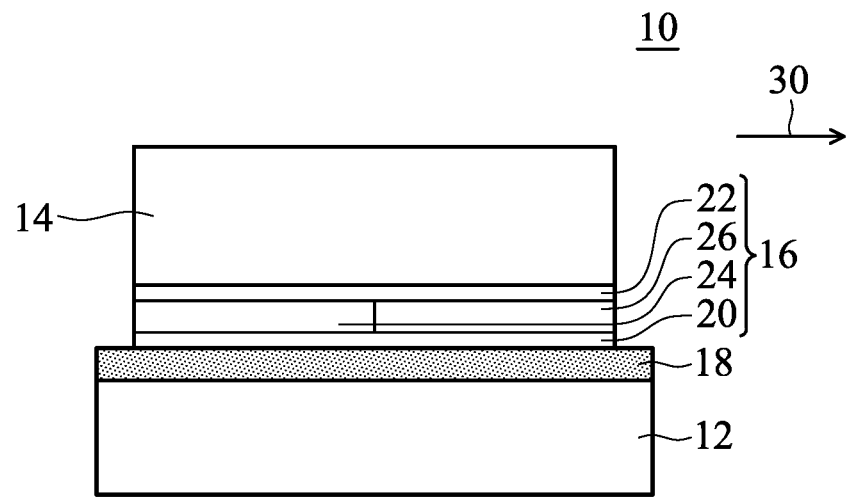
FIG. 5 is a cross-sectional view of a ferroelectric memory in accordance with one embodiment of the present disclosure.

Referring to FIG. 5, in accordance with one embodiment of the present disclosure, a ferroelectric memory (Ferroelectric RAM; FeRAM) 10 is provided. FIG. 5 is a cross-sectional view of the ferroelectric memory 10.

As shown in FIG. 5, the ferroelectric memory 10 includes a first electrode 12, a second electrode 14, a ferroelectric composite layer 16 and an insulating layer 18. The first electrode 12 is opposite to the second electrode 14. The ferroelectric composite layer 16 is disposed between the first electrode 12 and the second electrode 14. The insulating layer 18 is disposed on one side of the ferroelectric composite layer 16. In FIG. 5, the insulating layer 18 is disposed between the first electrode 12 and the ferroelectric composite layer 16. That is, the insulating layer 18 is disposed on the side of the ferroelectric composite layer 16 facing the first electrode 12, and is in contact with the first electrode 12 and the ferroelectric composite layer 16 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 5, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 5, the ferroelectric layer 24 and the antiferroelectric layer 26 are disposed between the first electrode layer 20 and the second electrode layer 22 in a horizontal direction 30. In one embodiment, a plurality of ferroelectric layers 24 and a plurality of antiferroelectric layers 26 may be included between the first electrode layer 20 and the second electrode layer 22, which are arranged to alternate with one another in the horizontal direction 30 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the insulating layer 18 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 5, the insulating layer 18 is in contact with the first electrode 12 and the first electrode layer 20 of the ferroelectric composite layer 16 respectively.

Figure 6:
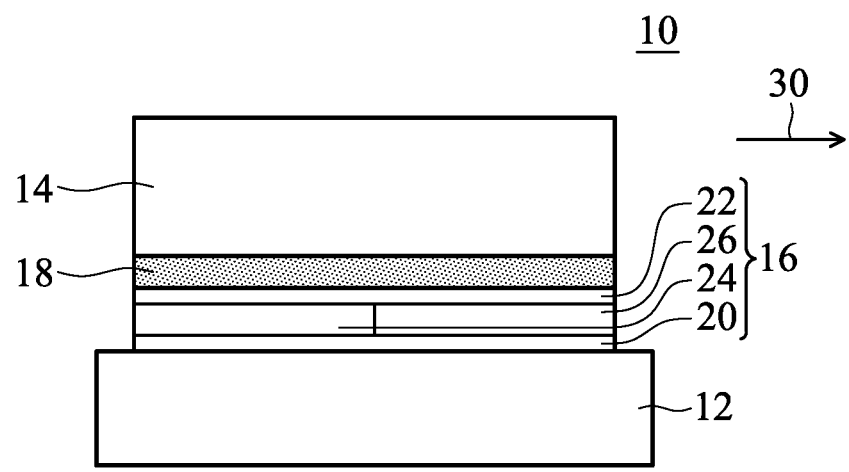
FIG. 6 is a cross-sectional view of a ferroelectric memory in accordance with one embodiment of the present disclosure.

Referring to FIG. 6, in accordance with one embodiment of the present disclosure, a ferroelectric memory (Ferroelectric RAM; FeRAM) 10 is provided. FIG. 6 is a cross-sectional view of the ferroelectric memory 10.

As shown in FIG. 6, the ferroelectric memory 10 includes a first electrode 12, a second electrode 14, a ferroelectric composite layer 16 and an insulating layer 18. The first electrode 12 is opposite to the second electrode 14. The ferroelectric composite layer 16 is disposed between the first electrode 12 and the second electrode 14. The insulating layer 18 is disposed on one side of the ferroelectric composite layer 16. In FIG. 6, the insulating layer 18 is disposed between the ferroelectric composite layer 16 and the second electrode 14. That is, the insulating layer 18 is disposed on the side of the ferroelectric composite layer 16 facing the second electrode 14, and is in contact with the ferroelectric composite layer 16 and the second electrode 14 respectively.

In one embodiment, the first electrode 12 and the second electrode 14 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 6, the ferroelectric composite layer 16 includes a first electrode layer 20, a second electrode layer 22, a ferroelectric layer 24 and an antiferroelectric layer 26. The first electrode layer 20 is opposite to the second electrode layer 22. The ferroelectric layer 24 and the antiferroelectric layer 26 are disposed between the first electrode layer 20 and the second electrode layer 22. In accordance with FIG. 6, the ferroelectric layer 24 and the antiferroelectric layer 26 are disposed between the first electrode layer 20 and the second electrode layer 22 in a horizontal direction 30. In one embodiment, a plurality of ferroelectric layers 24 and a plurality of antiferroelectric layers 26 may be included between the first electrode layer 20 and the second electrode layer 22, which are arranged to alternate with one another in the horizontal direction 30 (not shown).

In one embodiment, the first electrode layer 20 and the second electrode layer 22 may include metal or semiconductor materials, for example, titanium nitride (TiN), however, the present disclosure is not limited thereto, and other suitable metal or semiconductor materials are also applicable. In one embodiment, the first electrode layer 20 and the second electrode layer 22 have a dominant crystallographic orientation of (220). In one embodiment, the ferroelectric layer 24 and the antiferroelectric layer 26 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the insulating layer 18 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 6, the insulating layer 18 is in contact with the second electrode layer 22 of the ferroelectric composite layer 16 and the second electrode 14 respectively.

Figure 7:
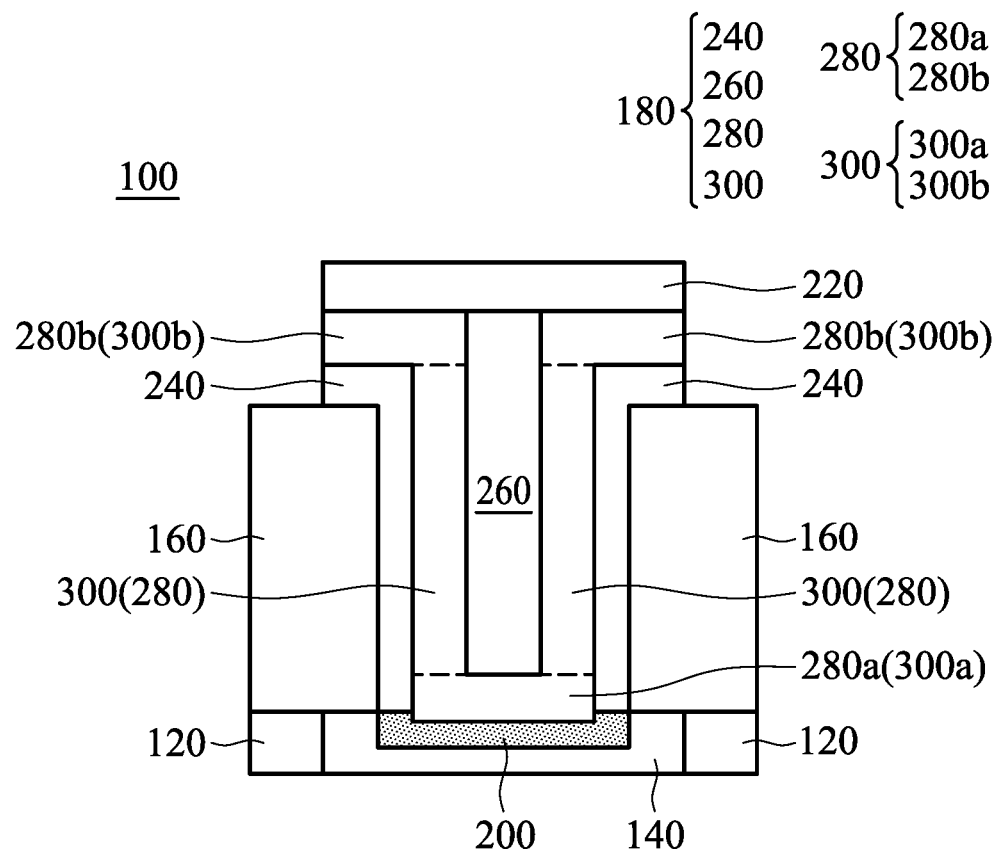
FIG. 7 is a cross-sectional view of a ferroelectric memory in accordance with one embodiment of the present disclosure.

Referring to FIG. 7, in accordance with one embodiment of the present disclosure, a ferroelectric memory (Ferroelectric RAM; FeRAM) 100 is provided. FIG. 7 is a cross-sectional view of the ferroelectric memory 100.

The ferroelectric memory 100 includes a substrate 120, a first electrode 140, a patterned oxide layer 160, a ferroelectric composite layer 180, an insulating layer 200 and a second electrode 220. The first electrode 140 is disposed in the substrate 120. The patterned oxide layer 160 is disposed on the substrate 120, exposing a part of the first electrode 140. The ferroelectric composite layer 180 is disposed on the exposed first electrode 140 and located within the patterned oxide layer 160. The insulating layer 200 is disposed on one side of the ferroelectric composite layer 180. In FIG. 7, the insulating layer 200 is disposed between the first electrode 140 and the ferroelectric composite layer 180. That is, the insulating layer 200 is disposed on the side of the ferroelectric composite layer 180 facing the first electrode 140, and is in contact with the first electrode 140 and the ferroelectric composite layer 180 respectively. The second electrode 220 is disposed on the ferroelectric composite layer 180.

In one embodiment, the first electrode 140 and the second electrode 220 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 7, the ferroelectric composite layer 180 includes a first electrode layer 240, a second electrode layer 260, a ferroelectric layer 280 and an antiferroelectric layer 300. The first electrode layer 240 is opposite to the second electrode layer 260. The ferroelectric layer 280 and the antiferroelectric layer 300 are disposed between the first electrode layer 240 and the second electrode layer 260. In accordance with FIG. 7, the ferroelectric layer 280 and the antiferroelectric layer 300 are connected to each other and disposed between the first electrode layer 240 and the second electrode layer 260. For example, the first region 280a of the ferroelectric layer 280 is disposed on the exposed first electrode 140. The ferroelectric layer 300 is disposed between the first electrode layer 240 and the second electrode layer 260. The second region 280b of the ferroelectric layer 280 is disposed on the antiferroelectric layer 300 and the first electrode layer 240. In one embodiment, the connection of the ferroelectric layer 280 and the antiferroelectric layer 300 can also be interchanged. For example, the first region 300a of the antiferroelectric layer 300 is disposed on the exposed first electrode 140. The ferroelectric layer 280 is disposed between the first electrode layer 240 and the second electrode layer 260. The second region 300b of the antiferroelectric layer 300 is disposed on the ferroelectric layer 280 and the first electrode layer 240, as shown in FIG. 7.

In one embodiment, the first electrode layer 240 and the second electrode layer 260 may include metal or semiconductor materials, for example, titanium nitride (TiN), however, the present disclosure is not limited thereto, and other suitable metal or semiconductor materials are also applicable. In one embodiment, the first electrode layer 240 and the second electrode layer 260 have a dominant crystallographic orientation of (220). In one embodiment, the ferroelectric layer 280 and the antiferroelectric layer 300 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the insulating layer 200 may include, for example, silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 7, the insulating layer 200 is in contact with the first electrode 140, the ferroelectric layer 280 (or the antiferroelectric layer 300) of the ferroelectric composite layer 180 and the first electrode layer 240 respectively.

Figure 8:
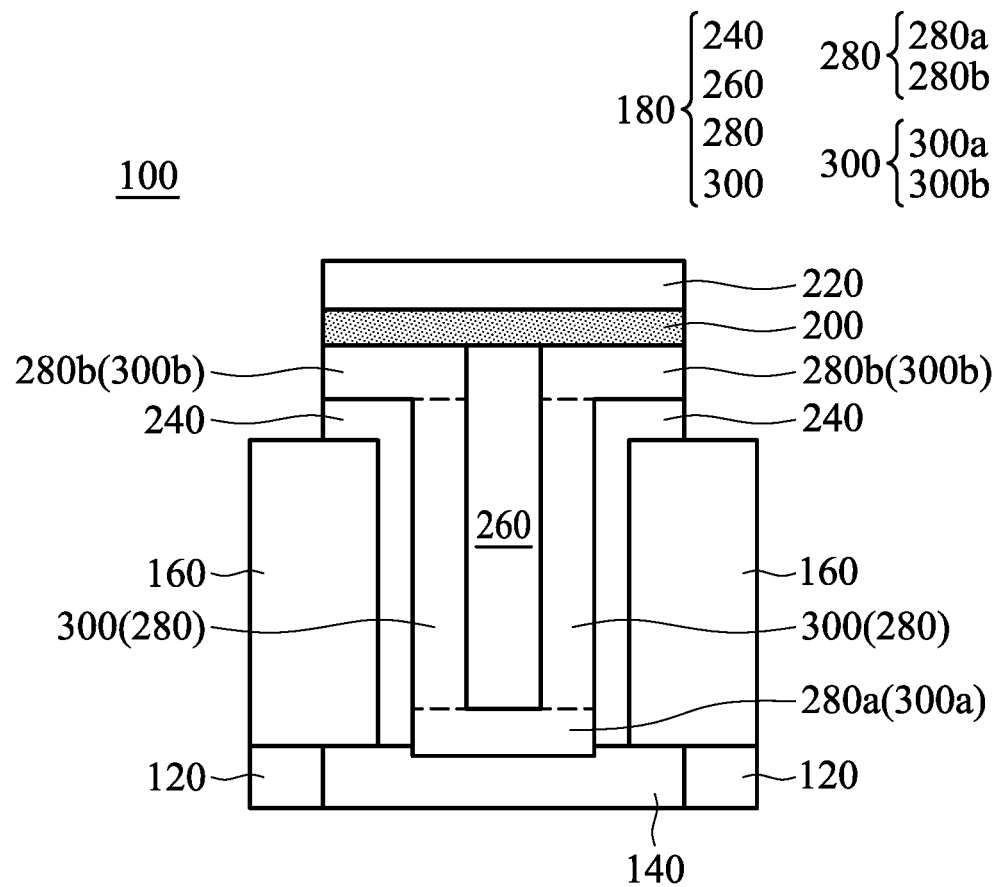
FIG. 8 is a cross-sectional view of a ferroelectric memory in accordance with one embodiment of the present disclosure.

Referring to FIG. 8, in accordance with one embodiment of the present disclosure, a ferroelectric memory (Ferroelectric RAM; FeRAM) 100 is provided. FIG. 8 is a cross-sectional view of the ferroelectric memory 100.

The ferroelectric memory 100 includes a substrate 120, a first electrode 140, a patterned oxide layer 160, a ferroelectric composite layer 180, an insulating layer 200 and a second electrode 220. The first electrode 140 is disposed in the substrate 120. The patterned oxide layer 160 is disposed on the substrate 120, exposing a part of the first electrode 140. The ferroelectric composite layer 180 is disposed on the exposed first electrode 140 and located within the patterned oxide layer 160. The insulating layer 200 is disposed on one side of the ferroelectric composite layer 180. The second electrode 220 is disposed on the ferroelectric composite layer 180. In FIG. 8, the insulating layer 200 is disposed between the ferroelectric composite layer 180 and the second electrode 220. That is, the insulating layer 200 is disposed on the side of the ferroelectric composite layer 180 facing the second electrode 220, and is in contact with the ferroelectric composite layer 180 and the second electrode 220 respectively.

In one embodiment, the first electrode 140 and the second electrode 220 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 8, the ferroelectric composite layer 180 includes a first electrode layer 240, a second electrode layer 260, a ferroelectric layer 280 and an antiferroelectric layer 300. The first electrode layer 240 is opposite to the second electrode layer 260. The ferroelectric layer 280 and the antiferroelectric layer 300 are disposed between the first electrode layer 240 and the second electrode layer 260. In accordance with FIG. 8, the ferroelectric layer 280 and the antiferroelectric layer 300 are connected to each other and disposed between the first electrode layer 240 and the second electrode layer 260. For example, the first region 280a of the ferroelectric layer 280 is disposed on the exposed first electrode 140. The ferroelectric layer 300 is disposed between the first electrode layer 240 and the second electrode layer 260. The second region 280b of the ferroelectric layer 280 is disposed on the antiferroelectric layer 300 and the first electrode layer 240. In one embodiment, the connection of the ferroelectric layer 280 and the antiferroelectric layer 300 can also be interchanged. For example, the first region 300a of the antiferroelectric layer 300 is disposed on the exposed first electrode 140. The ferroelectric layer 280 is disposed between the first electrode layer 240 and the second electrode layer 260. The second region 300b of the antiferroelectric layer 300 is disposed on the ferroelectric layer 280 and the first electrode layer 240, as shown in FIG. 8.

In one embodiment, the first electrode layer 240 and the second electrode layer 260 may include metal or semiconductor materials, for example, titanium nitride (TiN), however, the present disclosure is not limited thereto, and other suitable metal or semiconductor materials are also applicable. In one embodiment, the first electrode layer 240 and the second electrode layer 260 have a dominant crystallographic orientation of (220). In one embodiment, the ferroelectric layer 280 and the antiferroelectric layer 300 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the insulating layer 200 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 8, the insulating layer 200 is in contact with the second electrode 220, the ferroelectric layer 280 (or the antiferroelectric layer 300) of the ferroelectric composite layer 180 and the second electrode layer 260 respectively.

Figure 9:
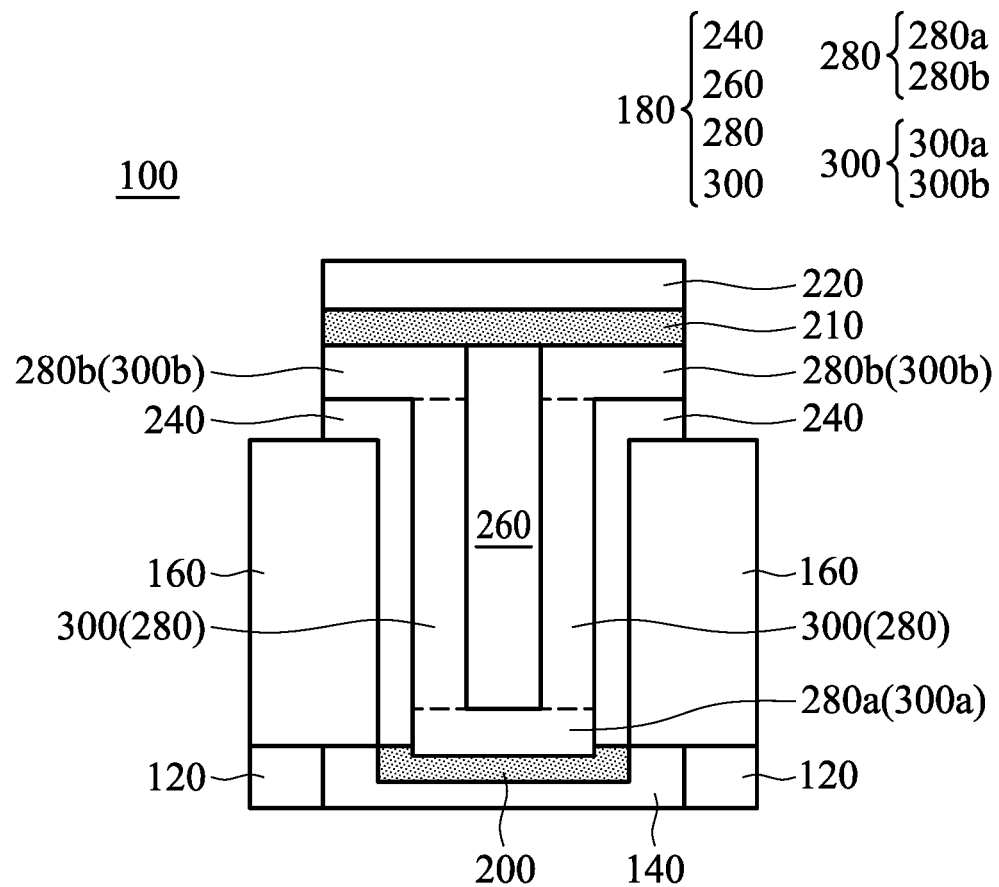
FIG. 9 is a cross-sectional view of a ferroelectric memory in accordance with one embodiment of the present disclosure.

Referring to FIG. 9, in accordance with one embodiment of the present disclosure, a ferroelectric memory (Ferroelectric RAM; FeRAM) 100 is provided. FIG. 9 is a cross-sectional view of the ferroelectric memory 100.

The ferroelectric memory 100 includes a substrate 120, a first electrode 140, a patterned oxide layer 160, a ferroelectric composite layer 180, a first insulating layer 200, a second insulating layer 210 and a second electrode 220. The first electrode 140 is disposed in the substrate 120. The patterned oxide layer 160 is disposed on the substrate 120, exposing a part of the first electrode 140. The ferroelectric composite layer 180 is disposed on the exposed first electrode 140 and located within the patterned oxide layer 160. The first insulating layer 200 is disposed on one side of the ferroelectric composite layer 180. The second insulating layer 210 is disposed on the other side of the ferroelectric composite layer 180. The second electrode 220 is disposed on the ferroelectric composite layer 180. In FIG. 9, the first insulating layer 200 is disposed between the first electrode 140 and the ferroelectric composite layer 180. That is, the first insulating layer 200 is disposed on the side of the ferroelectric composite layer 180 facing the first electrode 140, and is in contact with the first electrode 140 and the ferroelectric composite layer 180 respectively. In addition, the second insulating layer 210 is disposed between the ferroelectric composite layer 180 and the second electrode 220. That is, the second insulating layer 210 is disposed on the side of the ferroelectric composite layer 180 facing the second electrode 220, and is in contact with the ferroelectric composite layer 180 and the second electrode 220 respectively.

In one embodiment, the first electrode 140 and the second electrode 220 may include metal or semiconductor materials. For example, zirconium (Zr), hafnium (Hf), titanium nitride (TiN), titanium (Ti), tantalum (Ta), tantalum nitride (TaN), tantalum silicide (TaSi), tantalum carbonitride (TaCN), titanium aluminum nitride (TiAlN), zinc (Zn), nickel (Ni), nickel silicide (NiSi), ruthenium (Ru), carbon (C), silicon (Si), silicon nitride (SiNx), germanium (Ge), platinum (Pt), aluminum (Al), aluminum nitride (AlN), yttrium (Y), gadolinium (Gd), strontium (Sr), tungsten (W), tungsten silicide (WSi), tungsten nitride (WN), gallium (Ga) or gallium nitride (GaN), however, the present disclosure is not limited thereto, and other suitable metal or semiconductor materials are also applicable.

In FIG. 9, the ferroelectric composite layer 180 includes a first electrode layer 240, a second electrode layer 260, a ferroelectric layer 280 and an antiferroelectric layer 300. The first electrode layer 240 is opposite to the second electrode layer 260. The ferroelectric layer 280 and the antiferroelectric layer 300 are disposed between the first electrode layer 240 and the second electrode layer 260. In accordance with FIG. 9, the ferroelectric layer 280 and the antiferroelectric layer 300 are connected to each other and disposed between the first electrode layer 240 and the second electrode layer 260. For example, the first region 280a of the ferroelectric layer 280 is disposed on the exposed first electrode 140. The ferroelectric layer 300 is disposed between the first electrode layer 240 and the second electrode layer 260. The second region 280b of the ferroelectric layer 280 is disposed on the antiferroelectric layer 300 and the first electrode layer 240. In one embodiment, the connection of the ferroelectric layer 280 and the antiferroelectric layer 300 can also be interchanged. For example, the first region 300a of the antiferroelectric layer 300 is disposed on the exposed first electrode 140. The ferroelectric layer 280 is disposed between the first electrode layer 240 and the second electrode layer 260. The second region 300b of the antiferroelectric layer 300 is disposed on the ferroelectric layer 280 and the first electrode layer 240, as shown in FIG. 9.

In one embodiment, the first electrode layer 240 and the second electrode layer 260 may include metal or semiconductor materials, for example, titanium nitride (TiN), however, the present disclosure is not limited thereto, and other suitable metal or semiconductor materials are also applicable. In one embodiment, the first electrode layer 240 and the second electrode layer 260 have a dominant crystallographic orientation of (220). In one embodiment, the ferroelectric layer 280 and the antiferroelectric layer 300 may include hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$), however, the present disclosure is not limited thereto, and other suitable ferroelectric materials are also applicable.

In one embodiment, the first insulating layer 200 and the second insulating layer 210 may include silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx), however, the present disclosure is not limited thereto, and other suitable insulating materials are also applicable. In accordance with FIG. 9, the first insulating layer 200 is in contact with the first electrode 140, the ferroelectric layer 280 (or the antiferroelectric layer 300) of the ferroelectric composite layer 180 and the first electrode layer 240 respectively. The second insulating layer 210 is in contact with the second electrode 220, the ferroelectric layer 280 (or the antiferroelectric layer 300) of the ferroelectric composite layer 180 and the second electrode layer 260 respectively.

Example 1

The Relationship Between the Number of Operations (Cycle) and the Polarization of the Ferroelectric Memory In this example, under the condition of an applied electric field strength of 2.5 MV/cm, the traditional ferroelectric memory (without an insulating layer) and the disclosed ferroelectric memory (with an insulating layer, such as the component structure shown in FIG. 3) were tested for changes in polarization based on the number of operations. The results are shown in FIG. 10.

Figure 10:
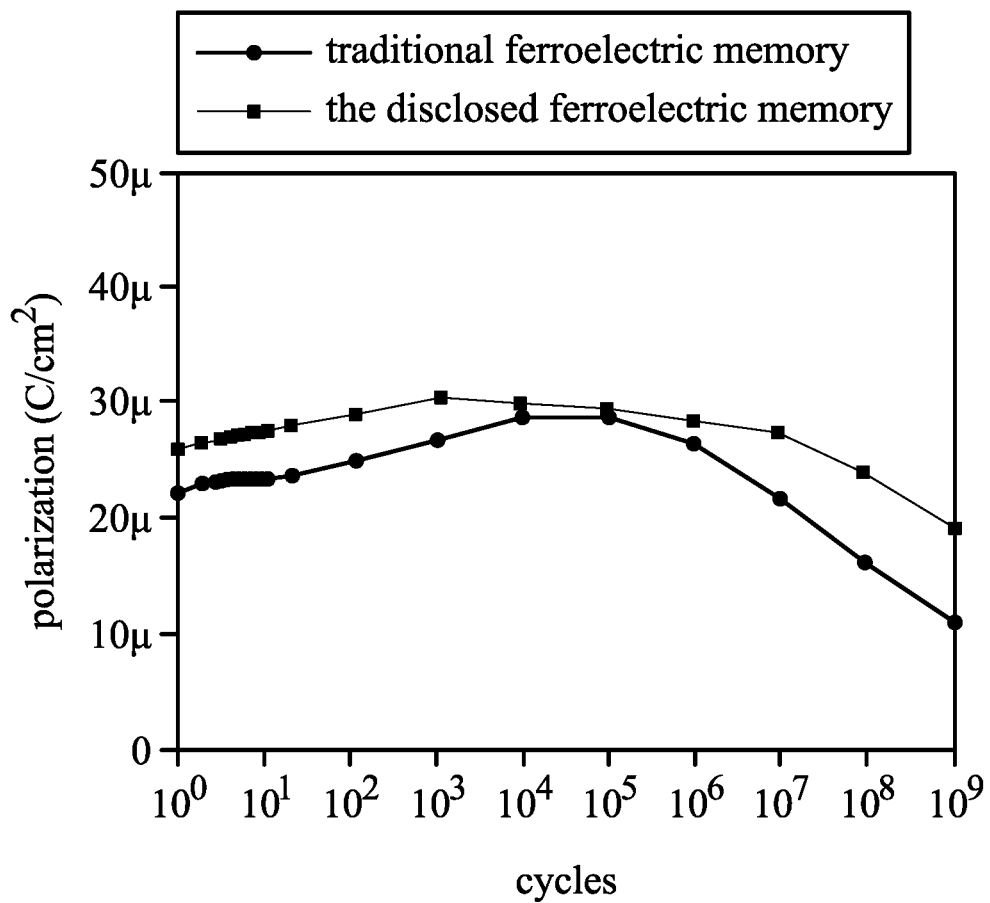
FIG. 10 shows the relationship between the number of operations and the polarization of a ferroelectric memory in accordance with one embodiment of the present disclosure.

It can be seen from FIG. 10 that when the number of operations gradually increases and the fatigue effect stage is entered, the polarization of the traditional ferroelectric memory (without current limitation during the wake-up stage; the current value was 10 mA) shows a sharp decline as the number of operations continues to increase. However, for the disclosed ferroelectric memory (current limited in the wake-up stage; the current value was 1 mA), even if it enters the fatigue effect stage, the numerical change of its polarization can be maintained relatively smoothly. This property increases the number of operations of the component to $10^{10}$ or more.

In the disclosure, an insulating layer with a current limiting effect is arranged on one or both sides of the ferroelectric composite layer. The above-mentioned insulating layer provides a current limiting mechanism such as a Schottky barrier or Poole-Frenkel conduction, which limits the transient current of the component during high-speed operation, reducing the damage of the current to the components. Therefore, even if it has entered the fatigue effect stage, the component can still maintain a considerable amount of polarization, slowing down the deterioration rate of the component, and increasing the number of operations of the component.

While the disclosure has been described by way of example and in terms of embodiments, it should be understood that the disclosure is not limited thereto. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. Ferroelectric memories with ferroelectric composite layers, comprising:
   a first electrode;
   a second electrode opposite to the first electrode;
   a ferroelectric composite layer disposed between the first electrode and the second electrode,
   wherein the ferroelectric composite layer comprises a first electrode layer, a second electrode layer, a ferroelectric layer and an antiferroelectric layer,
   wherein the first electrode layer is opposite to the second electrode layer, and the ferroelectric layer and the antiferroelectric layer are disposed between the first electrode layer and the second electrode layer,
   wherein orthogonal projections of the first electrode layer, the second electrode layer, the ferroelectric layer and the antiferroelectric layer are within a top surface of the first electrode; and
   a first insulating layer disposed on one side of the ferroelectric composite layer.

2. The ferroelectric memories with ferroelectric composite layers as claimed in claim 1, wherein the first electrode and the second electrode comprise metal or semiconductor materials.

3. The ferroelectric memories with ferroelectric composite layers as claimed in claim 1, wherein the first electrode layer and the second electrode layer comprise titanium nitride.

4. The ferroelectric memories with ferroelectric composite layers as claimed in claim 1, wherein the first electrode layer and the second electrode layer have a dominant crystallographic orientation of (220).

5. The ferroelectric memories with ferroelectric composite layers as claimed in claim 1, wherein the ferroelectric layer and the antiferroelectric layer are arranged with one another in a perpendicular direction m.

6. The ferroelectric memories with ferroelectric composite layers as claimed in claim 1, wherein the ferroelectric layer and the antiferroelectric layer are arranged with one another in a horizontal direction.

7. The ferroelectric memories with ferroelectric composite layers as claimed in claim 1, wherein the ferroelectric layer and the antiferroelectric layer comprise hafnium zirconium oxide (HfZrO$_x$), hafnium silicon oxide (HfSiO$_x$), hafnium oxide (HfO$_x$), hafnium yttrium oxide (HfYO$_x$), hafnium gadolinium oxide (HfGdO$_x$), hafnium strontium oxide (HfSrO$_x$), strontium titanium oxide (SrTiO$_x$), strontium calcium titanate (SrCaTiO$_3$), Ag(Nb$_{1-x}$Ta$_x$)O$_3$, barium strontium titanate (BaSrTiO$_3$), barium titanate (BaTiO$_3$), zirconium oxide (ZrO$_x$) or hafnium aluminum oxide (HfAlO$_x$).

8. The ferroelectric memories with ferroelectric composite layers as claimed in claim 1, further comprising a second insulating layer disposed on the other side of the ferroelectric composite layer.

9. The ferroelectric memories with ferroelectric composite layers as claimed in claim 8, wherein the first insulating layer and the second insulating layer comprise silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide (AlO$_x$), aluminum titanium carbonitrides (AlTiCN), zinc oxide (ZnO) or zirconium oxide (ZrOx).

10. Ferroelectric memories with ferroelectric composite layers, comprising:
    a substrate;
    a first electrode disposed in the substrate;
    a patterned oxide layer disposed on the substrate, exposing a part of the first electrode;
    a ferroelectric composite layer disposed on the exposed first electrode and located within the patterned oxide layer;

a first insulating layer disposed on one side of the ferroelectric composite layer; and a second electrode disposed on the ferroelectric composite layer, wherein the ferroelectric composite layer comprises a first electrode layer, a second electrode layer, a ferroelectric layer and an antiferroelectric layer, wherein the first electrode layer is opposite to the second electrode layer, and the ferroelectric layer and the antiferroelectric layer are disposed between the first electrode layer and the second electrode layer, wherein a first region of the ferroelectric layer is disposed on the exposed first electrode, the antiferroelectric layer is disposed between the first electrode layer and the second electrode layer, a second region of the ferroelectric layer is disposed on the antiferroelectric layer and the first electrode layer, or a first region of the antiferroelectric layer is disposed on the exposed first electrode, the ferroelectric layer is disposed between the first electrode layer and the second electrode layer, and a second region of the antiferroelectric layer is disposed on the ferroelectric layer and the first electrode layer.

11. The ferroelectric memories with ferroelectric composite layers as claimed in claim 10, wherein the first electrode and the second electrode comprise metal or semiconductor materials.

12. The ferroelectric memories with ferroelectric composite layers as claimed in claim 10, wherein the first electrode layer and the second electrode layer comprise titanium nitride.

13. The ferroelectric memories with ferroelectric composite layers as claimed in claim 10, wherein the first electrode layer and the second electrode layer have a dominant crystallographic orientation of (220).

14. The ferroelectric memories with ferroelectric composite layers as claimed in claim 10, wherein the first ferroelectric layer and the antiferroelectric electrode layer are connected to each other.

15. The ferroelectric memories with ferroelectric composite layers as claimed in claim 10, wherein the first ferroelectric layer and the antiferroelectric electrode layer comprise hafnium zirconium oxide ($HfZrO_x$), hafnium silicon oxide ($HfSiO_x$), hafnium oxide ($HfO_x$), hafnium yttrium oxide ($HfYO_x$), hafnium gadolinium oxide ($HfGdO_x$), hafnium strontium oxide ($HfSrO_x$), strontium titanium oxide ($SrTiO_x$), strontium calcium titanate ($SrCaTiO_3$), $Ag(Nb_{1-x}Ta_x)O_3$, barium strontium titanate ($BaSrTiO_3$), barium titanate ($BaTiO_3$), zirconium oxide ($ZrO_x$) or hafnium aluminum oxide ($HfAlO_x$).

16. The ferroelectric memories with ferroelectric composite layers as claimed in claim 10, further comprising a second insulating layer disposed on the other side of the ferroelectric composite layer.

17. The ferroelectric memories with ferroelectric composite layers as claimed in claim 16, wherein the first insulating layer and the second insulating layer comprise silicon oxide (SiOx), titanium oxide (TiOx), titanium oxynitride (TiON), tantalum oxide (TaOx), tantalum oxynitride (TaON), tungsten oxide (WOx), germanium oxide (GeOx), aluminum oxide ($AlO_x$), aluminum titanium carbonitrides (AlTiCN), zinc oxide (ZnO) or zirconium oxide (ZrOx).

* * * * *